(12) United States Patent
Endo et al.

(10) Patent No.: US 8,268,535 B2
(45) Date of Patent: *Sep. 18, 2012

(54) PATTERN FORMATION METHOD

(75) Inventors: Masayuki Endo, Osaka (JP); Masaru Sasago, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/085,232

(22) Filed: Apr. 12, 2011

(65) Prior Publication Data

US 2011/0189616 A1 Aug. 4, 2011

Related U.S. Application Data

(62) Division of application No. 11/958,661, filed on Dec. 18, 2007, now Pat. No. 7,947,432.

(30) Foreign Application Priority Data

Feb. 8, 2007 (JP) ................................. 2007-028929
Mar. 13, 2007 (JP) ................................. 2007-063172

(51) Int. Cl.
*G03F 7/26* (2006.01)
(52) U.S. Cl. ........................................................ 430/313
(58) Field of Classification Search .................. 430/311, 430/313, 316, 327, 330
See application file for complete search history.

(56) References Cited

U.S. PATENT DOCUMENTS

| 5,372,677 | A | 12/1994 | Katayama et al. | |
|---|---|---|---|---|
| 6,576,393 | B1 | 6/2003 | Sugita et al. | |
| 7,943,285 | B2 * | 5/2011 | Endo et al. | 430/313 |
| 7,947,432 | B2 * | 5/2011 | Endo et al. | 430/313 |
| 2002/0059557 | A1 | 5/2002 | Shin et al. | |
| 2004/0200513 | A1 | 10/2004 | Okuda et al. | |
| 2005/0186516 | A1 | 8/2005 | Endo et al. | |
| 2005/0255687 | A1 | 11/2005 | Jiang et al. | |
| 2006/0105272 | A1 | 5/2006 | Gallagher et al. | |
| 2006/0231524 | A1 | 10/2006 | Liu et al. | |

FOREIGN PATENT DOCUMENTS

| JP | 5-341536 | 12/1993 |
|---|---|---|
| JP | 2000-356854 A | 12/2000 |

OTHER PUBLICATIONS

Maenhoudt et al. "Double Patterning Scheme for sub-0.25 kl single damascene structures at NA=0.75, λ =193nm", Optical Microlithography XVIII, edited by Bruce W. Smith, Proceedings of SPIE, vol. 5754, pp. 1508-1518.
United States Office Action issued in U.S. Appl. No. 12/029,944, mailed Mar. 25, 2010.

* cited by examiner

*Primary Examiner* — Kathleen Duda
(74) *Attorney, Agent, or Firm* — McDermott Will & Emery LLP

(57) ABSTRACT

After forming a lower layer film, an intermediate layer film and a first resist film on a substrate, a first resist pattern is formed by performing first exposure. Then, after a first intermediate layer pattern is formed by transferring the first resist pattern onto the intermediate layer film, a second resist film is formed thereon, and a second resist pattern is formed by performing second exposure. Thereafter, a second intermediate layer pattern is formed by transferring the second resist pattern onto the intermediate layer film. After removing the second resist film, the lower layer film is etched by using the second intermediate layer pattern as a mask, so as to form a lower layer pattern.

18 Claims, 12 Drawing Sheets

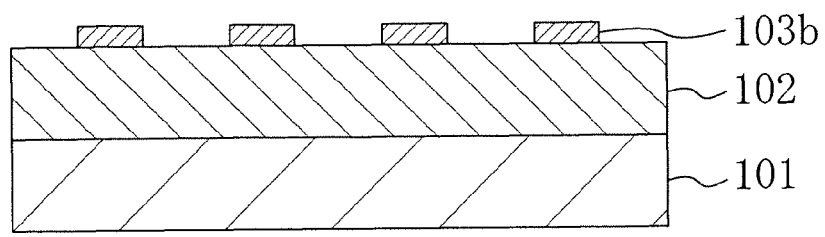
FIG. 4A
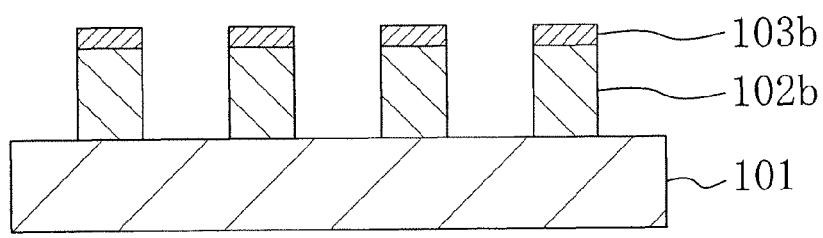
FIG. 4B
FIG. 5
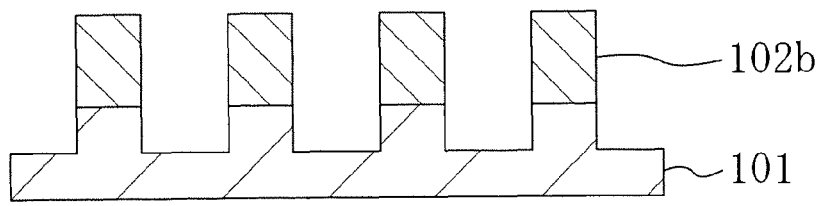

FIG. 9
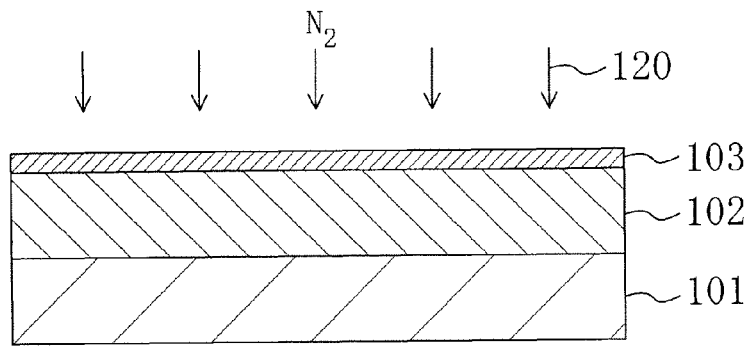
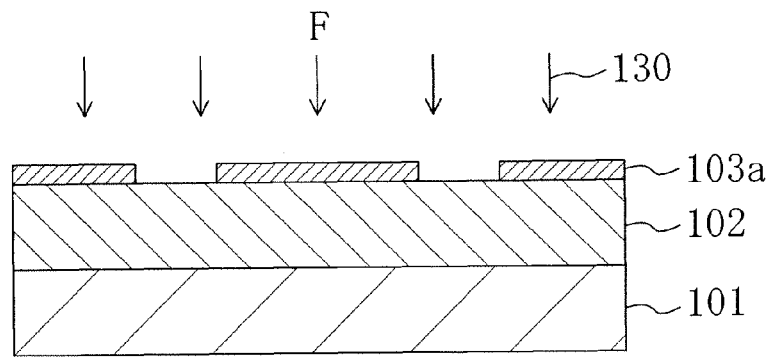
FIG. 10A
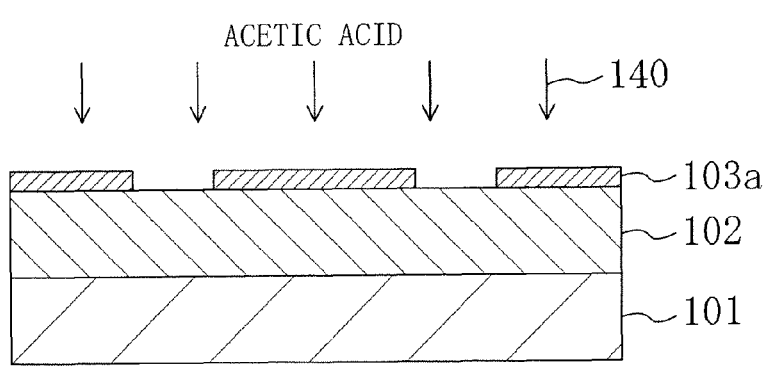
FIG. 10B

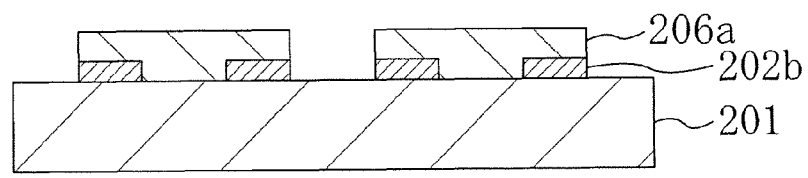
FIG. 13A
PRIOR ART
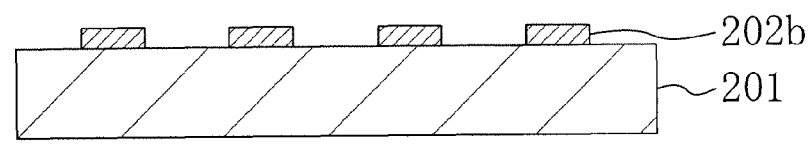
FIG. 13B
PRIOR ART
FIG. 14
PRIOR ART
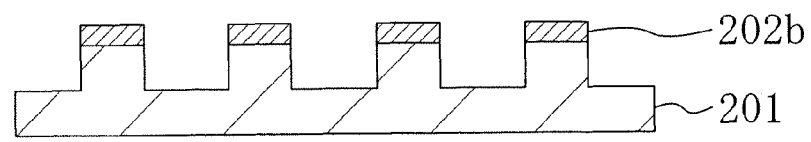

PATTERN FORMATION METHOD

CROSS-REFERENCE TO RELATED APPLICATIONS

This application is a Divisional of U.S. application Ser. No. 11/958,661, filed on Dec. 18, 2007, now U.S. Pat. No. 7,947,432, claiming priority of Japanese Application No. 2007-028929, filed on Feb. 8, 2007 and Japanese Application No. 2007-063172, filed on Mar. 13, 2007, the entire contents of each of which are hereby incorporated by reference.

BACKGROUND OF THE INVENTION

The present invention relates to a pattern formation method performed in semiconductor fabrication or the like, and more particularly, it relates to a pattern formation method employing double patterning.

In accordance with the increased degree of integration and downsizing of semiconductor devices, there are increasing demands for further rapid development of lithography technique. Currently, pattern formation is carried out through photolithography using a light source of a mercury lamp, KrF excimer laser, ArF excimer laser or the like. Furthermore, use of $F_2$ laser of a shorter wavelength has been examined, but since there are a large number of problems in exposure systems and resist materials, the development in the use of the $F_2$ laser is now being suspended.

In these circumstances, a method designated as double patterning has been recently proposed for realizing further refinement with a conventional exposure wavelength. In this method, exposure is performed with a desired mask pattern divided into two photomasks, and thus, the pattern contrast is improved.

The resolution attained in lithography is defined as $k_1 \cdot \lambda / NA$ (wherein $k_1$ is a process constant, $\lambda$ is an exposure wavelength and NA is a numerical aperture of an exposure system). When the double patterning is employed, the pattern contrast is improved so as to largely reduce the value of the process constant $k_1$, and hence, the resolution can be largely improved even with the same exposure wavelength.

Now, a conventional pattern formation method employing the double patterning will be described with reference to FIGS. 11A through 11D, 12A through 12D, 13A and 13B.

First, as shown in FIG. 11A, a hard mask 202 (made of, for example, a silicon nitride film) with a thickness of approximately 0.12 µm is formed on a semiconductor substrate 201.

Next, as shown in FIG. 11B, a first ArF resist film 203 with a thickness of approximately 0.15 µm is formed on the hard mask 202. Thereafter, first exposure is performed through a first photomask 204 with ArF excimer laser 205 with NA of 0.85. After the exposure, the first ArF resist film 203 is baked with a hot plate at a temperature of approximately 105° C. for 60 seconds.

Then, as shown in FIG. 11C, the first ArF resist film 203 is developed with a 2.38 wt % tetramethylammonium hydroxide developer, so as to form a first resist pattern 203a.

Next, as shown in FIG. 11D, the hard mask 202 is etched with a fluorine-based gas or the like by using the first resist pattern 203a as a mask, so as to form a first hard mask pattern 202a.

Subsequently, after removing the first resist pattern 203a by ashing with oxygen plasma as shown in FIG. 12A, a second ArF resist film 206 with a thickness of approximately 0.15 µm is formed on the first hard mask pattern 202a as shown in FIG. 12B.

Next, as shown in FIG. 12C, second exposure is performed through a second photomask 207 with the ArF excimer laser 205 with NA of 0.85. After the exposure, the first ArF resist film 203 is baked with a hot plate at a temperature of approximately 105° C. for 60 seconds.

Then, as shown in FIG. 12D, the second ArF resist film 206 is developed with a 2.38 wt % tetramethylammonium hydroxide developer, so as to form a second resist pattern 206a.

Next, as shown in FIG. 13A, the first hard mask pattern 202a is etched with a fluorine-based gas or the like by using the second resist pattern 206a as a mask. Thereafter, as shown in FIG. 13B, the second resist pattern 206a is removed by the ashing with oxygen plasma, so as to obtain a second hard mask pattern 202b.

In this manner, the fine second hard mask pattern 202b is obtained through the exposure of the resist films and the etching of the hard mask respectively performed twice. Therefore, the second hard mask pattern 202b thus formed by the double patterning can be used for dry etching, for example, the semiconductor substrate 201 (or a film to be etched (no shown) formed on the semiconductor substrate 201) for fine pattern lithography of the semiconductor substrate 201 (or the film to be etched).

In such a case, it is necessary for the hard mask 202 to have a given thickness sufficient for securing the dry etching resistance. Accordingly, when the second ArF resist film 206 is applied on the first hard mask pattern 202a as shown in FIG. 12B, it is apprehended that the application property may be degraded if the underlying first hard mask pattern 202a has a largely concavo-convex surface. In this case, the resolution attained in the second resist exposure is lowered, and hence, sufficient resolution cannot be attained although the double patterning is employed.

For overcoming such a problem, a method in which the first hard mask pattern 202a is planarized by using a BARC (bottom anti-reflection coating), that is, an anti-reflection film, is described in M. Maenhoudt et al., "Double Patterning scheme for sub-0.25 k1 single damascene structures at NA=0.75, λ=193 nm", Proc. SPIE. vol. 5754, 1508 (2005).

Specifically, the first hard mask pattern 202a is planarized by applying a BARC 208 thereon as shown in FIG. 15, and the second ArF resist film 206 is applied on the BARC 208. Thus, the application property can be improved. As a result, the lowering of the resolution otherwise caused in the second resist exposure can be prevented.

SUMMARY OF THE INVENTION

The double patterning employing the planarization with a BARC has, however, the following problems:

A hard mask is required to have dry etching resistance, and for example, when a hard mask cannot attain sufficient etch selectivity against a material to be etched, it is necessary for the hard mask to have a large thickness to some extent. In this case, a resultant hard mask pattern has a largely concavo-convex surface, which may cause voids formed in concaves during the planarization with the BARC. Furthermore, a BARC also has a function as an anti-reflection film, and its reflectance is difficult to control because the thickness of the BARC used for the planarization is varied between a region where the hard mask pattern is formed and a region where it is not formed. In addition, in the case where immersion lithography, which is regarded as a technique to improve the NA of ArF excimer laser exposure, is employed in the double patterning, a sufficient anti-reflection effect is necessary for improving the resolution by the immersion lithography, but the sufficient anti-reflection effect is difficult to attain merely by using the BARC.

The present invention was devised in consideration of these conventional problems, and a principal object of the invention is providing a pattern formation method in which high resolution attained by the double patterning can be maximally exhibited.

In order to achieve the object, in the pattern formation method of this invention, a lower layer film is provided beneath an intermediate layer film, an intermediate layer pattern is formed by transferring a resist pattern formed through two mask exposures onto the intermediate layer film, and then, the intermediate layer pattern is transferred onto the lower layer film. Thus, a desired pattern (a lower layer pattern) is formed.

At this point, the intermediate layer film is principally used as a layer onto which the resist pattern formed through the two mask exposures is transferred, and the dry etching resistance is secured mainly by the lower layer film onto which the intermediate layer pattern obtained through the transfer of the resist pattern is further transferred. Accordingly, the intermediate layer film used for this purpose can be made thinner than a conventionally used hard mask, and hence, the lowering of the resolution derived from the degradation of the resist application property can be suppressed without planarizing the intermediate layer pattern. Needless to say, even when the planarization with a BARC or the like is performed, formation of voids in concaves can be suppressed, and hence, a good resist pattern can be formed. Furthermore, since the lower layer film used for the aforementioned purpose is formed in a comparatively large thickness, variation in its thickness is small, the reflectance of the lower layer film can be easily controlled, and a sufficient anti-reflection effect can be exhibited by the two layers of the intermediate layer film and the lower layer film. Therefore, even when the immersion lithography is employed in the double patterning of this invention, the high resolution can be retained with high NA.

The pattern formation method of this invention includes the steps of (a) forming a lower layer film on a substrate; (b) forming an intermediate layer film on the lower layer film; (c) forming a first resist pattern by forming a first resist film on the intermediate layer film, exposing the first resist film through a first photomask having a first pattern and developing the exposed first resist film; (d) forming a first intermediate layer pattern by etching the intermediate layer film with the first resist pattern used as a mask; (e) removing the first resist film; (f) forming a second resist pattern by forming a second resist film on the lower layer film and the first intermediate layer pattern, exposing the second resist film through a second photomask having a second pattern and developing the exposed second resist film after the step (e); (g) forming a second intermediate layer pattern by etching the intermediate layer film with the second resist pattern used as a mask; (h) removing the second resist film; and (i) forming a lower layer pattern in a shape of the first pattern and the second pattern by etching the lower layer film with the second intermediate layer pattern used as a mask after the step (h).

According to the pattern formation method employing the double patterning of this invention, a fine pattern with a size approximately ¼ of an exposure wavelength can be formed with high dry etching resistance and with high resolution attained by the double patterning maximally exhibited.

BRIEF DESCRIPTION OF THE DRAWINGS

FIGS. 4A and 4B are cross-sectional views for showing other procedures in the pattern formation method of Embodiment 1 of the invention.

FIG. 5 is a cross-sectional view for showing a procedure for etching a semiconductor substrate by using a pattern formed by the pattern formation method of Embodiment 1 of the invention.

FIG. 6A is a cross-sectional view for showing an immersion lithography procedure performed in first pattern exposure and FIG. 6B is a cross-sectional view for showing the immersion lithography procedure performed in second pattern exposure.

FIG. 7A is a cross-sectional view for showing a procedure for forming a barrier film before the first pattern exposure and FIG. 7B is a cross-sectional view for showing a procedure for forming a barrier film before the second pattern exposure.

FIG. 9 is a cross-sectional view for showing a procedure in a pattern formation method according to Embodiment 2 of the invention.

FIGS. 10A and 10B are diagrams for showing modifications of Embodiment 2 of the invention, and specifically, FIG. 10A is a cross-sectional view for showing a procedure for etching a surface portion of a first intermediate layer pattern and FIG. 10B is a cross-sectional view for showing a procedure for performing an acid treatment on the surface of the first intermediate layer pattern.

FIGS. 13A and 13B are cross-sectional views for showing other procedures in the conventional pattern formation method employing the double patterning.

FIG. 14 is a cross-sectional view for showing a procedure for etching a semiconductor substrate by using a pattern formed by the conventional pattern formation method employing the double patterning.

DETAILED DESCRIPTION OF THE INVENTION

Figure 1A:
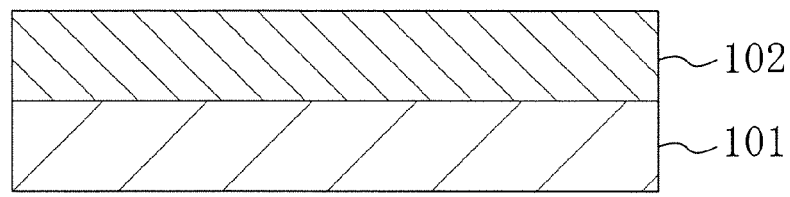
FIGS. 1A, 1B and 1C are cross-sectional views for showing procedures in a pattern formation method according to Embodiment 1 of the invention.

Preferred embodiments of the invention will now be described with reference to the accompanying drawings. It is noted that like reference numerals are used to refer to like elements in the drawings mentioned below for simplifying the description. It is also noted that the present invention is not limited to the embodiments described below.

Embodiment 1

A pattern formation method according to Embodiment 1 of the invention will now be described with reference to FIGS. 1A through 1C, 2A through 2D, 3A through 3D, 4A and 4B.

First, as shown in FIG. 1A, a lower layer film 102 with a thickness of approximately 0.7 μm is formed on a semiconductor substrate 101. At this point, the lower layer film 102 is an organic film made of, for example, an organic material obtained by curing, through thermal cross-linkage or the like, a substance having a hydrocarbon skeleton. The hydrocarbon skeleton may include an alkyl group, a alkenyl group, a phenyl group, a halogen group or the like. Specifically, a material including a cross linking agent of a resin such as a novolak resin or a phenol resin having an epoxy group, a glycidyl group or the like; and a thermal acid generator such as an onium salt is preferably used. When such a material is used, an acid is generated by annealing the lower layer film 102 after forming the lower layer film 102 on the semiconductor substrate 101, so that the cross linking agent can be crosslinked through the function of the acid. Thus, the lower layer film 102 can be made rigid.

Figure 1B:
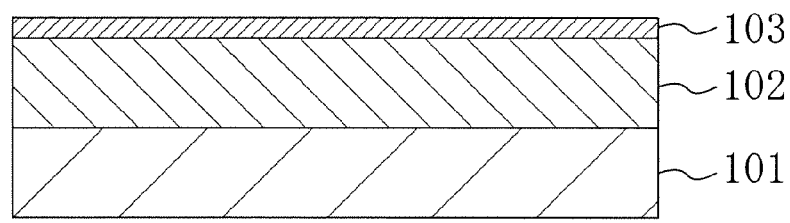

Next, as shown in FIG. 1B, an intermediate layer film 103 with a thickness of approximately 0.08 μm is formed on the lower layer film 102. At this point, the intermediate layer film 103 can be made of, for example, a material including silicon having a $SiO_2$ skeleton, a SiN skeleton or a SiON skeleton. Such a skeleton may have an alkyl group, an alkenyl group, a phenyl group, a halogen group or the like. Specifically, the intermediate layer film 103 can be made of a siloxane resin or a silsesquioxane resin, which may include an alkyl group such as a methyl group or an ethyl group.

Figure 1C:
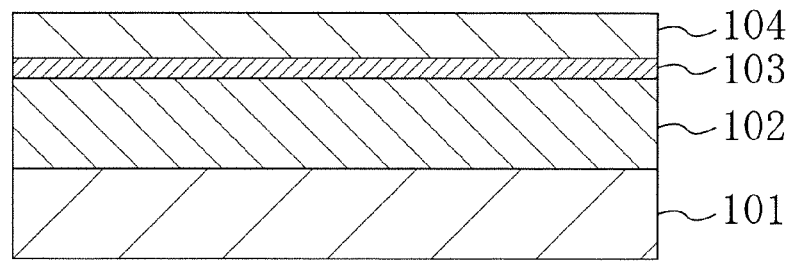

Then, as shown in FIG. 1C, a first resist film 104 with a thickness of approximately 0.15 μm is formed on the intermediate layer film 103. At this point, the first resist film 104 can be made of, for example, a chemically amplified resist for ArF excimer laser (PAR-855 manufactured by Sumitomo Chemical Co. Ltd.).

Figure 2A:
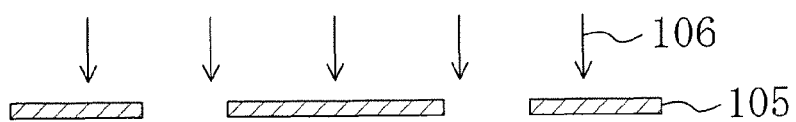
FIGS. 2A, 2B, 2C and 2D are cross-sectional views for showing other procedures in the pattern formation method of Embodiment 1 of the invention.

Next, as shown in FIG. 2A, first pattern exposure is performed through a first photomask 105 having a first pattern with ArF excimer laser 106 with NA of 0.85. After the exposure, the first resist film 104 is baked with a hot plate at a temperature of 105° C. for 60 seconds (post exposure bake).

Figure 2B:
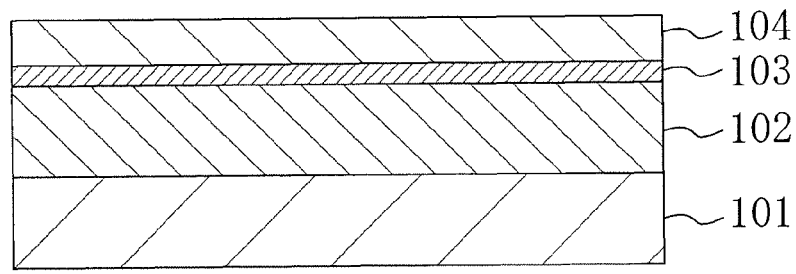

Subsequently, as shown in FIG. 2B, the resultant first resist film 104 is developed with a 2.38 wt % tetramethylammonium hydroxide aqueous solution (an alkaline developer), so as to form a first resist pattern 104a made of an unexposed portion of the first resist film 104.

Figure 2C:
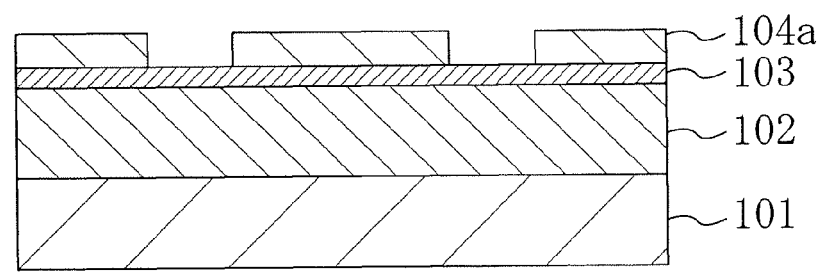
Figure 2D:
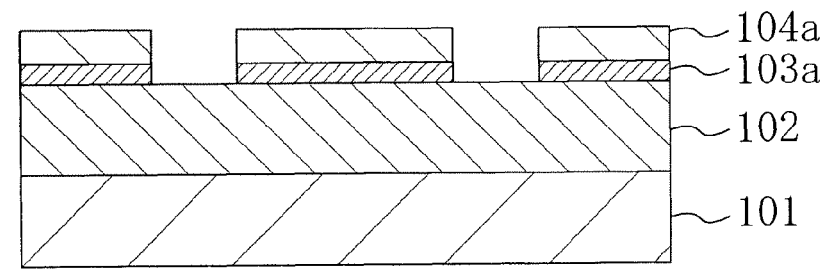

Next, the intermediate layer film 103 is etched with, for example, a fluorine-based gas by using the first resist pattern 104a as a mask as shown in FIG. 2C, and the first resist pattern 104a is then removed through ashing with oxygen plasma so as to form an intermediate layer pattern 103a as shown in FIG. 2D.

Figure 3A:
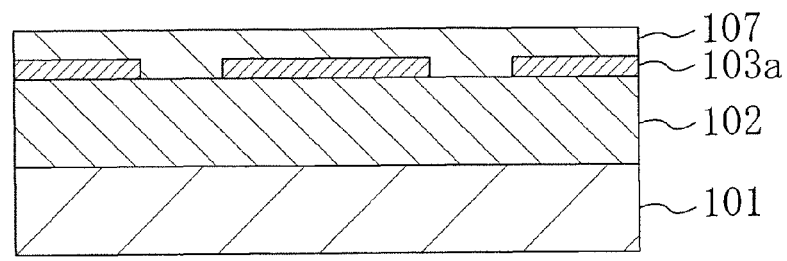
FIGS. 3A, 3B, 3C and 3D are cross-sectional views for showing other procedures in the pattern formation method of Embodiment 1 of the invention.

Then, as shown in FIG. 3A, a second resist film 107 with a thickness of 0.15 μm is formed on the first intermediate layer pattern 103a. At this point, since the intermediate layer film 103 is formed in a small thickness, the second resist film 107 can be formed on the first intermediate layer pattern 103a with a high application property. It is noted that the second resist film 107 can be made of the same material as the first resist film 104.

Figure 3B:
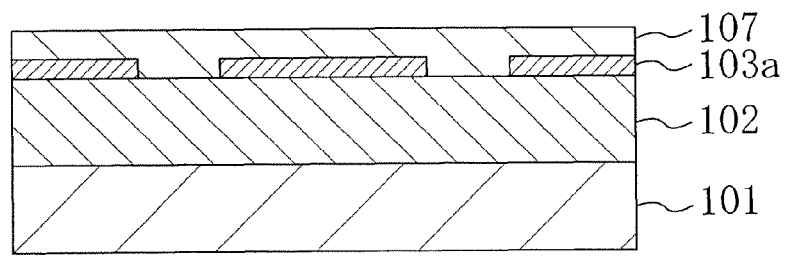

Next, as shown in FIG. 3B, second pattern exposure is performed through a second photomask 108 having a second pattern with ArF excimer laser 108 with NA of 0.85. After the exposure, the second resist film 107 is subjected to the post exposure bake with a hot plate at a temperature of 105° C. for 60 seconds.

Figure 3C:
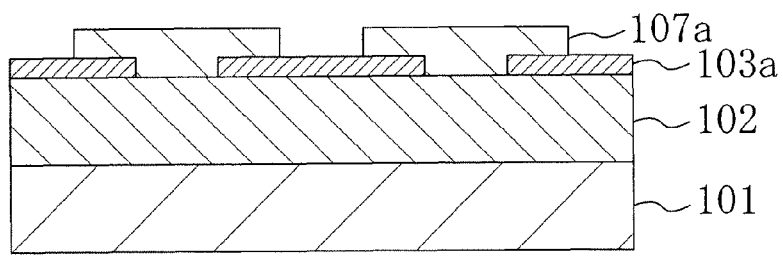

Subsequently, as shown in FIG. 3C, the resultant second resist film 107 is developed with a 2.38 wt % tetramethylammonium hydroxide aqueous solution (an alkaline developer), so as to form a second resist pattern 107a made of an unexposed portion of the second resist film 107. Since the second resist film 107 is formed with a high application property, the second resist pattern 107a can be satisfactorily formed through the second resist exposure.

Figure 3D:
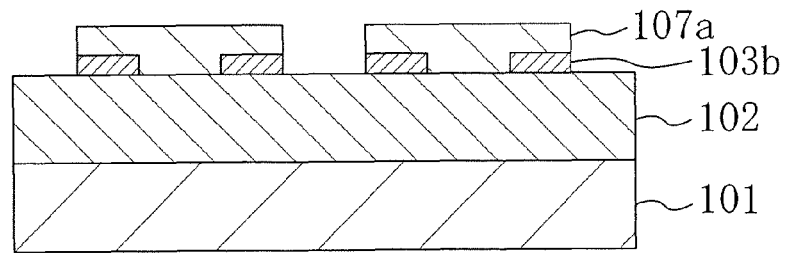

Next, the first intermediate layer pattern 103a is etched with, for example, a fluorine-based gas by using the second resist pattern 107a as a mask as shown in FIG. 3D, and the second resist pattern 107a is removed through the ashing with oxygen plasma, so as to form a second intermediate layer pattern 103b as shown in FIG. 4A.

Ultimately, as shown in FIG. 4B, the lower layer film 102 is etched with an oxygen-based gas by using the second intermediate layer pattern 103b as a mask, so as to form a lower layer pattern 102b in a shape of the first and second patterns.

In the pattern formation method of this embodiment, both the resist patterns 104a and 107a can be satisfactorily formed respectively through the first and second resist exposures, and these resist patterns 104a and 107a are transferred respectively onto the intermediate layer film 103 and the lower layer film 102. Thus, the pattern 102b refined to approximately ¼ of the exposure wavelength can be formed with high resolution attained by the double patterning maximally exhibited.

FIG. 5 is a cross-sectional view of the semiconductor substrate 101 (or a film to be etched (not shown) formed on the semiconductor substrate 101) dry etched by using the lower layer pattern 102b formed in this embodiment. Since the lower layer pattern 102b has high dry etching resistance, the semiconductor substrate 101 (or the film to be etched) can be finely processed in a good shape.

It goes without saying that the lower layer pattern 102b formed in this embodiment is applicable not only to a mask for the dry etching but also to a mask used in any of various procedures performed in fabrication process of semiconductor devices (such as a mask for ion implantation).

The materials for the lower layer film 102 and the intermediate layer film 103 are not limited those exemplified in this embodiment but may be appropriately selected in accordance with the material for the first and second resist films 104 and 107 used in the pattern formation method employing the double patterning using the lower layer film 102 and the intermediate layer film 103 or in accordance with the procedure to be performed by using the lower layer pattern 102b formed in this embodiment (such as etching or ion implantation).

Moreover, since the two layers of the lower layer film 102 and the intermediate layer film 103 are used in this embodiment, the intermediate layer film 103 can be formed in a small thickness as described above, and therefore, the degradation in the application property of the second resist film 107 can be suppressed. Needless to say, in order to further improve the application property, a BARC may be applied on the intermediate layer pattern 103a for planarization before forming the second resist film 107 thereon.

Modification of Embodiment 1

High resolution attained by the double patterning can be maximally exhibited by employing the pattern formation method of this invention, and when the immersion lithography is further employed, the high resolution attained by the double patterning can be further improved.

Figure 6A:
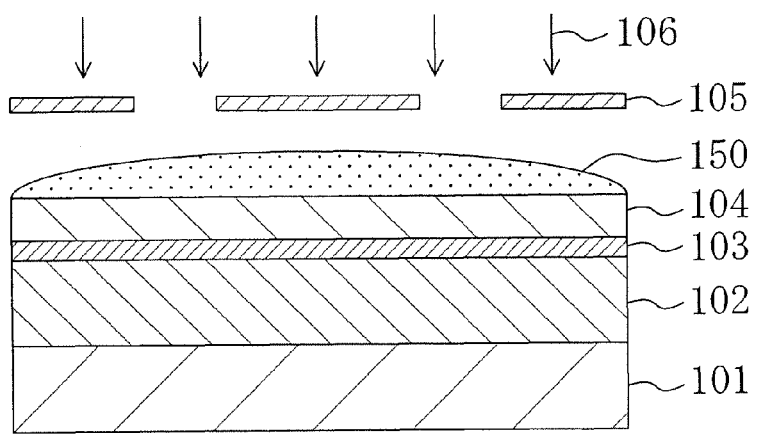
FIGS. 6A and 6B are diagrams for showing modifications of Embodiment 1 of the invention, and specifically.
Figure 6B:
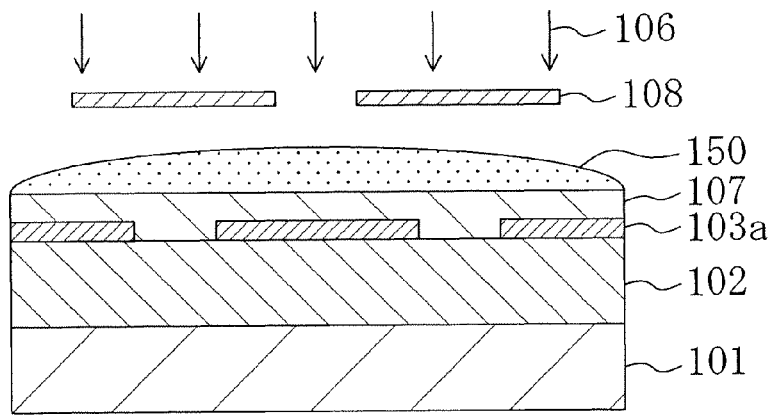

FIGS. 6A and 6B are cross-sectional views for showing procedures in which the immersion lithography is employed in the double patterning of Embodiment 1, and more specifically, the immersion lithography is employed in the first resist exposure in the procedure shown in FIG. 6A and in the second resist exposure in the procedure shown in FIG. 6B.

FIG. 6A is a cross-sectional view for showing a procedure corresponding to that shown in FIG. 2A, and this first pattern exposure is performed by irradiating the first resist film 104 with the ArF excimer laser 106 through the first photomask 105 with an immersion liquid (immersion solution) 150 of water provided by a puddle method onto the first resist film 104.

FIG. 6B is a cross-sectional view for showing a procedure corresponding to that shown in FIG. 3B, and this second pattern exposure is performed by irradiating the second resist film 107 with the ArF excimer laser 106 through the second photomask 108 with the immersion solution 150 of water provided by the puddle method onto the second resist film 107.

When the immersion lithography is thus employed, a space in an exposure system disposed between a lens and a resist film formed on a substrate is filled with a liquid (immersion solution) having a refractive index n, and therefore, the NA (the numerical aperture) of the exposure system has a value n·NA. Thus, the resolution of the resist film can be improved. As a result, as compared with the case where the general exposure technique is employed, a fine pattern can be formed in a better shape.

At this point, the immersion solution 150 can be water or an acidic solution. As the acidic solution, a cesium sulfate aqueous solution, a phosphoric acid aqueous solution or the like may be used, and the immersion solution 150 may further include an additive such as a surface active agent.

In the case where the immersion lithography is thus employed, when the immersion solution 150 is provided on the resist film 104 or 107 as shown in FIG. 6A or 6B, a component of the resist film 104 or 107 may be eluted into the immersion solution 150 or the immersion solution 150 may permeate into the resist film 104 or 107. In either case, the resolution is lowered.

Figure 7A:
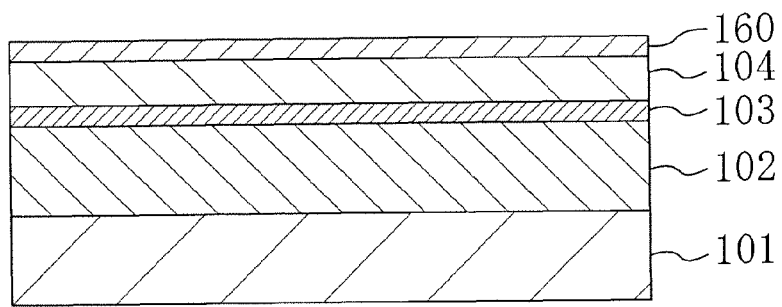
FIGS. 7A and 7B are diagrams for showing modifications of Embodiment 1 of the invention, and specifically.
Figure 7B:
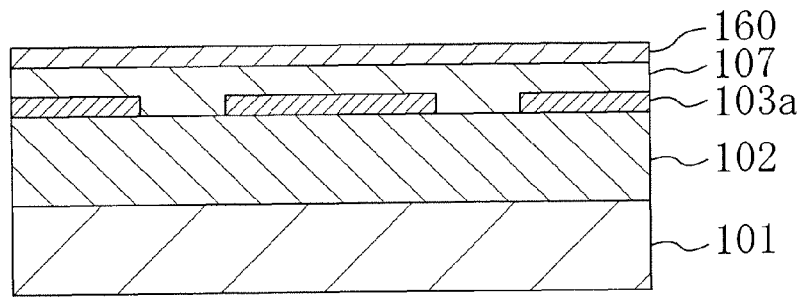

For coping with this problem, it is effective to form a barrier film 160 on the resist film 104 or 107 as shown in FIG. 7A or 7B. FIG. 7A is a cross-sectional view for showing a procedure corresponding to that shown in FIG. 1C, in which the barrier film 160 with a thickness of approximately 0.1 μm is formed on the first resist film 104. After this procedure, the immersion lithography shown in FIG. 6A is performed. FIG. 7B is a cross-sectional view for showing a procedure corresponding to that shown in FIG. 3A, in which the barrier film 160 with a thickness of approximately 0.1 μm is formed on the second resist film 107. After this procedure, the immersion lithography shown in FIG. 6B is performed.

At this point, the barrier film may be made of an alkali-soluble material including fluorine (such as TCX-041 manufactured by JSR Corporation). Also, after forming the barrier film 160, it may be annealed with a hot plate at a temperature of 120° C. for 90 seconds for improving its denseness. It is noted that the barrier film 160 is preferably annealed at an appropriate temperature because it is difficult to remove when excessively improved in the denseness. The appropriate annealing temperature for improving the denseness of the barrier film 160 is, for example, 100 through 150° C.

The immersion lithography and the formation of the barrier film 160 may be employed in both of or one of the first and second pattern exposures.

Embodiment 2

Figure 8A:
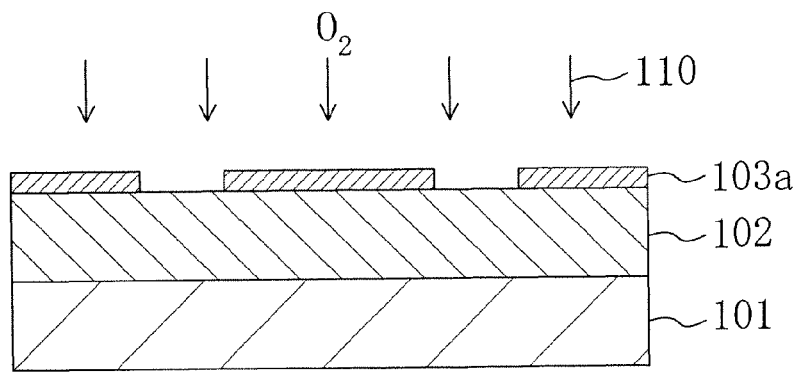
FIGS. 8A, 8B and 8C are cross-sectional views for explaining a problem of double patterning of this invention.
Figure 8B:
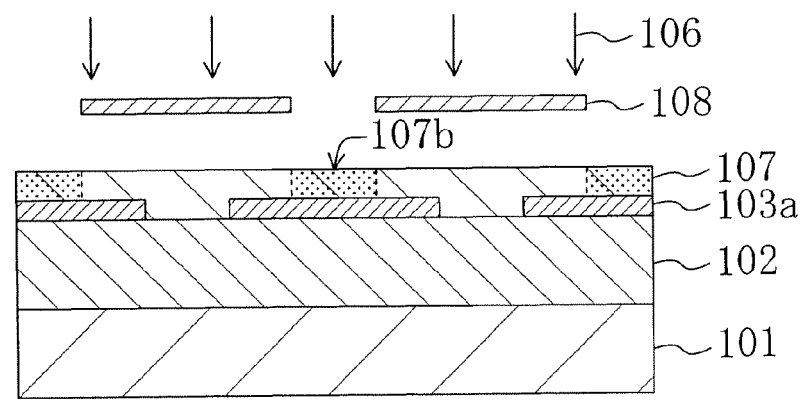
Figure 8C:
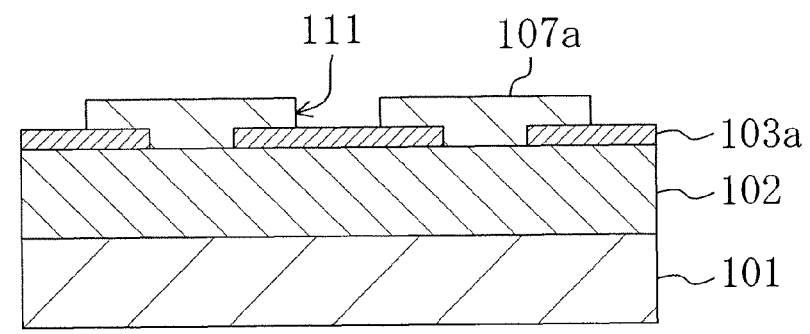
Figure 11A:
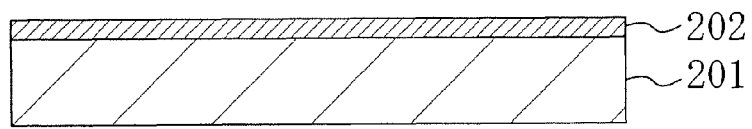
FIGS. 11A, 11B, 11C and 11D are cross-sectional views for showing procedures in a conventional pattern formation method employing double patterning.
Figure 11B:
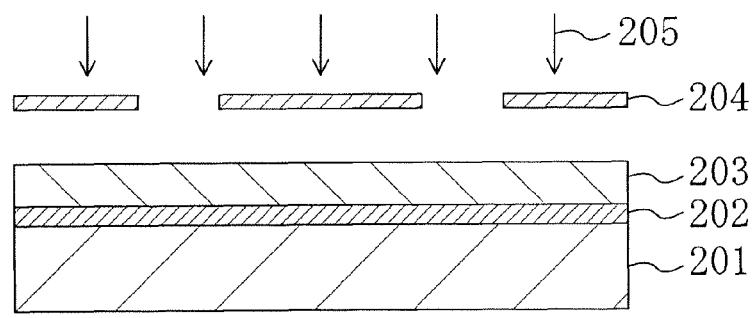
Figure 11C:
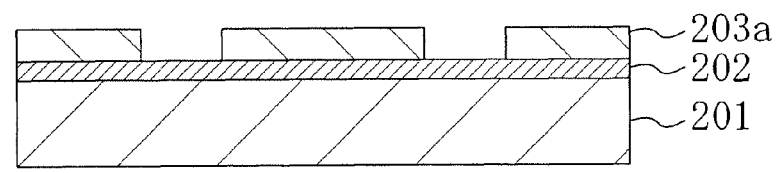
Figure 11D:
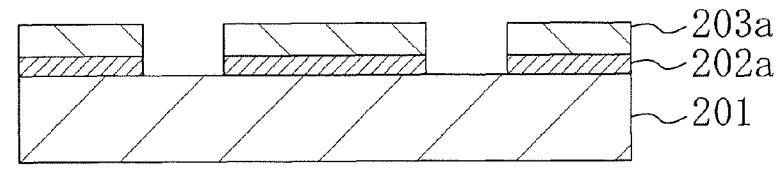
Figure 12A:
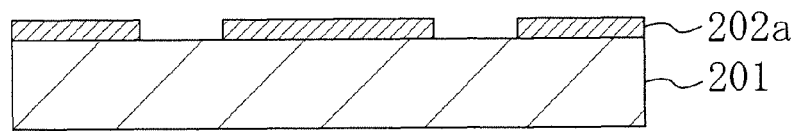
FIGS. 12A, 12B, 12C and 12D are cross-sectional views for showing other procedures in the conventional pattern formation method employing the double patterning.
Figure 12B:
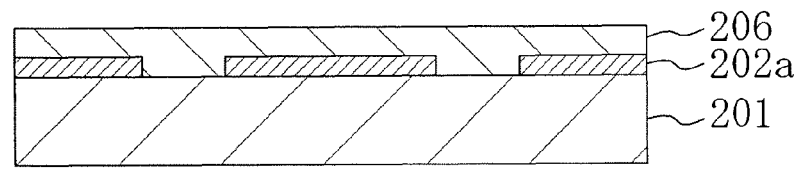
Figure 12C:
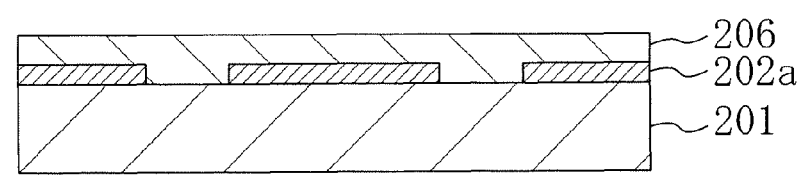
Figure 12D:
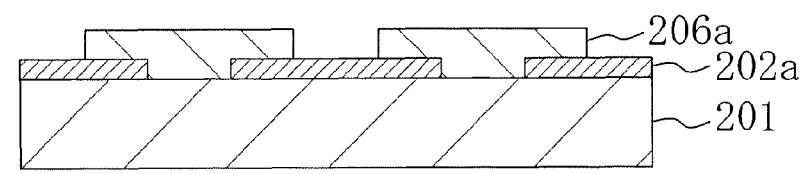
Figure 15:
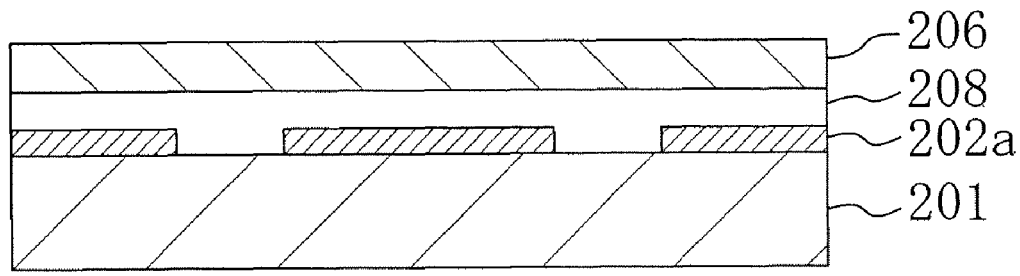
FIG. 15 is a cross-sectional view for showing a conventional double patterning method employing BARC planarization process.

Although a fine pattern with high dry etching resistance can be formed by the pattern formation method employing the double patterning of this invention, the present inventors have found that the double patterning of this invention has the following problem, which will now be described with reference to FIGS. 8A through 8C:

FIGS. 8A through 8C are cross-sectional views for showing procedures in which after the first pattern exposure is performed for forming the first intermediate layer pattern 103a, the second pattern exposure is performed for forming the second resist pattern 107a, and specifically, FIGS. 8A through 8C respectively correspond to FIGS. 2D, 3B and 3C.

Since the first resist pattern 104a formed through the first pattern exposure is removed through the ashing with the oxygen plasma, the surface of the first intermediate layer pattern 103a is exposed to the oxygen plasma (because over-ashing is always performed for completely removing the first resist pattern 104a) as shown in FIG. 8A. Therefore, the surface of the first intermediate layer pattern 103a is roughened by the ashing.

When the second pattern exposure is performed under this condition as shown in FIG. 8B, the acid generated in an exposed portion 107b of the second resist film 107 enters recesses of the roughened surface of the first intermediate layer pattern 103a and cannot move, namely, the acid is placed in a trapped state, and therefore, the acid cannot exhibit its function. As a result, when the second resist film 107 is developed as shown in FIG. 8C, it is apprehended that shortage of the acid in the exposed portion 107b causes pattern failure of a rough pattern edge or increase of dimensional variation.

In this manner, the rough surface of the intermediate layer pattern 103a caused by the ashing cannot be avoided in the pattern formation method employing the double patterning of this invention.

Therefore, the present inventors have further examined the problem, resulting in finding the following effective countermeasure, which will now be described with reference to the accompanying drawing as a pattern formation method of Embodiment 2 of the invention:

FIG. 9 is a cross-sectional view for showing a procedure corresponding to that shown in FIG. 1B, in which the surface of the intermediate layer film 103 is subjected to a plasma treatment with an inert gas after forming the intermediate layer 103 on the lower layer film 102 and before forming the first resist film 104 on the intermediate layer film 103. Thus, the surface of the intermediate layer film 103 can be made dense, so that portions for trapping the acid generated during the exposure (namely, the recesses formed on the surface of the intermediate layer film 103) can be reduced. As a result, the pattern failure and the dimensional variation derived from the shortage of the acid in the exposed portion 107b can be suppressed.

In this case, the inert gas may be, for example, nitrogen or a rare gas. It is noted that a rare gas is preferably used because it less causes chemical change in the intermediate layer film 103 and has a smaller function to etch the intermediate layer film 103 than nitrogen. Examples of the rare gas are helium, neon, argon, krypton and xenon. Furthermore, the plasma treatment is performed under conditions for making the surface of the intermediate layer film 103 dense, and for example, it can be performed by spraying an Ar gas for approximately 10 seconds.

Also in this embodiment, it goes without saying that the immersion lithography and/or the formation of a barrier film can be employed in the first and/or second pattern exposure.

Modification of Embodiment 2

As described above, the surface of the first intermediate layer pattern 103a roughened by the ashing provides portions for trapping the acid, which causes the pattern failure in the second pattern exposure. Therefore, when a treatment for eliminating the trapping property derived from the surface roughness once caused is carried out before the second pattern exposure, the pattern failure and the dimensional variation derived from the shortage of the acid in an exposed portion can be suppressed in the second pattern exposure.

Now, examples of such a treatment will be described with reference to FIGS. 10A and 10B, each of which shows a procedure corresponding to that shown in FIG. 2D.

In the treatment shown in FIG. 10A, after removing the first resist pattern 104a by the ashing, a surface portion of the first intermediate layer pattern 103a is etched before forming the second resist film 107 on the first intermediate layer pattern 103a. The etching is carried out by using, for example, a fluorine-based gas, and the first intermediate layer pattern 103a is etched in a surface portion with a thickness of approximately 1 through 5 nm. It is noted that the lower layer film 102 is not etched with the fluorine-based gas because it is made of an organic material.

When the surface roughness of the first intermediate layer pattern 103a is thus removed by the etching, the trapping property caused by the surface roughness can be eliminated, and hence, the pattern failure and the dimensional variation derived from the shortage of the acid in an exposed portion can be suppressed in the second pattern exposure.

In the treatment shown in FIG. 10B, after removing the first resist pattern 104a by the ashing, the surface of the first intermediate layer pattern 103a is subjected to an acid treatment before forming the second resist film 107 on the first intermediate layer pattern 103a. The acid treatment is carried out by spraying, for example, acetic acid onto the surface of the first intermediate layer pattern 103a for approximately 5 through 30 seconds. When the surface of the first intermediate layer pattern 103a is thus subjected to the acid treatment, the trapping portions formed by the surface roughness can be replenished with the acid, so that the trapping property derived from the surface roughness can be substantially eliminated. As a result, the pattern failure and the dimensional variation derived from the shortage of the acid in an exposed portion can be suppressed in the second pattern exposure.

The acid used in the acid treatment can be, for example, formic acid, methansulfonic acid or butansulfonic acid apart from acetic acid. It is noted that the acid used in the acid treatment of this invention is used for the purpose of supplying the acid to the trapping portions formed by the surface roughness of the first intermediate layer pattern 103a and is different from an oxidant of sulfonic acid or the like.

While the present invention has been described in preferred embodiments, it will be apparent to those skilled in the art that the disclosed invention may be modified in numerous ways and may assume many embodiments other than those specifically set out and described above. For example, the exposure is performed by using the ArF excimer laser in the above-described embodiments, which does not limit the invention, and for example, KrF excimer laser, $Xe_2$ laser, $F_2$ laser, KrAr laser, $Ar_2$ laser, extreme UV or the like may be used instead. Also, the degradation such as the pattern failure derived from the surface roughness of the first intermediate layer pattern 103a described in Embodiment 2 seems to be a problem common to the conventional double patterning using a hard mask, and hence, the countermeasures described in Embodiment 2 are applicable to the conventional double patterning using a hard mask.

What is claimed is:

1. A pattern formation method comprising steps of:
   (a) forming a lower layer film on a substrate;
   (b) forming an intermediate layer film on the lower layer film;
   (c) forming a first resist pattern by forming a first resist film on the intermediate layer film, exposing the first resist film through a first photomask having a first pattern and developing the exposed first resist film;
   (d) forming a first intermediate layer pattern by etching the intermediate layer film with the first resist pattern used as a mask in order to transfer the first resist pattern to the first intermediate layer so that the first intermediate layer pattern includes a pattern of the first resist pattern;
   (e) removing the first resist pattern;
   (f) forming a second resist pattern by forming a second resist film on the lower layer film and the first intermediate layer pattern, exposing the second resist film through a second photomask having a second pattern and developing the exposed second resist film after the step (e);
   (g) forming a second intermediate layer pattern by etching the first intermediate layer pattern with the second resist pattern used as a mask in order to transfer the second resist pattern to the first intermediate layer pattern so that the second intermediate layer pattern includes pattern of the first resist pattern and the second resist pattern;
   (h) removing the second resist pattern; and
   (i) forming a lower layer pattern in a shape of the first pattern and the second pattern by etching the lower layer film with the second intermediate layer pattern used as a mask after the step (h), wherein
   in the step (f), the second resist pattern is formed so as to be in contact with a part of an upper surface of the lower layer film.

2. The pattern formation method of claim 1,
   wherein the lower layer pattern is used as a mask for processing the substrate.

3. The pattern formation method of claim 2,
   wherein the lower layer pattern is used as a mask for dry etching.

4. The pattern formation method of claim 2,
   wherein the lower layer pattern is used as a mask for ion implantation.

5. The pattern formation method of claim 1,
   wherein the first resist pattern is removed by ashing with oxygen plasma in the step (e).

6. The pattern formation method of claim 1,
   wherein the second resist film is a chemically amplified resist film.

7. The pattern formation method of claim 1, further comprising, after the step (b) and before the step (c), a step of subjecting a surface of the intermediate layer film to a plasma treatment.

8. The pattern formation method of claim 7,
   wherein the plasma treatment is performed with an inert gas.

9. The pattern formation method of claim 1, further comprising, after the step (e) and before the step (f), a step of etching a surface portion of the first intermediate layer pattern.

10. The pattern formation method of claim 1, further comprising, after the step (e) and before the step (f), a step of subjecting the first intermediate layer pattern to an acid treatment.

11. The pattern formation method of claim 1,
    wherein immersion lithography is performed with a liquid provided on the first resist film or the second resist film in at least one of the steps (c) and (f).

12. The pattern formation method of claim 11, further comprising a step of forming a barrier film on the first resist film or the second resist film before performing the immersion lithography.

13. The pattern formation method of claim 11, wherein the liquid is water or an acidic solution.

14. The pattern formation method of claim 1, wherein the lower layer film is made of an organic material obtained by curing a substance having a hydrocarbon skeleton.

15. The pattern formation method of claim 14, wherein the lower layer film is made of a material including a resin, a cross linking agent and a thermal acid generator, and the lower layer film is annealed after forming the lower layer film on the substrate in the step (a).

16. The pattern formation method of claim 14, wherein in the step (i), the lower layer film is etched with an oxygen-based gas.

17. The pattern formation method of claim 1, wherein the intermediate layer film is made of a material having a $SiO_2$ skeleton, a SiN skeleton or a SiON skeleton.

18. The pattern formation method of claim 17, wherein in the steps (d) and (g), the intermediate layer film is etched with a fluorine-based gas.

* * * * *